United States Patent [19]

Kamiya

[11] 4,071,822
[45] Jan. 31, 1978

[54] DIGITAL VOLTAGE DETECTING CIRCUIT FOR A POWER SOURCE

[75] Inventor: Masaaki Kamiya, Tokyo, Japan

[73] Assignee: Kabushiki Kaisha Daini Seikosha, Japan

[21] Appl. No.: 723,947

[22] Filed: Sept. 16, 1976

[30] Foreign Application Priority Data

Sept. 16, 1975 Japan ................................ 50-111823

[51] Int. Cl.² ...................... G01R 19/00; G01R 19/26
[52] U.S. Cl. .................................... 324/111; 324/29.5; 324/99 D
[58] Field of Search ...................... 324/111, 99 D, 102, 324/29.5, 120, 140 R; 340/248 B, 248 C, 249

[56] References Cited

U.S. PATENT DOCUMENTS 3,316,547  4/1967  Amman ............................. 324/99 D Primary Examiner—Rudolph V. Rolinec
Assistant Examiner—Ernest F. Karlsen
Attorney, Agent, or Firm—Robert E. Burns; Emmanuel J. Lobato; Bruce L. Adams

[57] ABSTRACT

The output voltage of a power source is converted into a time signal by a circuit comprising a capacitor to which the voltage is applied, an MOS-FET connected across the capacitor and controlling its discharge rate in accordance with the voltage of the power source and a switching circuit which controls the MOS-FET. The time period representing the voltage of the power source is displayed digitally by counting the number of standard pulses occurring during the time period and digitally displaying the pulse count.

6 Claims, 8 Drawing Figures

DIGITAL VOLTAGE DETECTING CIRCUIT FOR A POWER SOURCE

BACKGROUND OF THE INVENTION

Many voltage detecting circuits have heretofore been proposed. For example, there is a circuit system which obtains a divided voltage by means of resistors and detects this divided voltage with an inverter and a display circuit which is driven by the variation of the output voltage of the inverter. However, since this circuit system is always in operation, it dissipates the power of the power source.

In order to overcome this defect, an intermittent circuit has been proposed. In this case, there is provided a voltage detecting circuit, the output signal of which becomes logic level "1" when the output signal is above a predetermined voltage level and becomes logic level "0" when the output signal is below the predetermined voltage level. Accordingly, this voltage detecting circuit detects only high voltage or low voltage.

SUMMARY OF THE INVENTION

It is an object of the present invention to provide a voltage detecting circuit which eliminates the disadvantages of detecting circuits heretofore proposed. According to the invention, the voltage of the power source is converted into a time value by the charging time or discharging time of a capacitor and this time value is displayed digitally so as to provide a digital display of the voltage of the power source.

It is a further object of the invention to provide a precise voltage detecting circuit which is not affected by variation of temperature or variation of a comparison power source.

BRIEF DESCRIPTION OF DRAWINGS

The nature, objects and advantages of the invention will be more fully understood from the following description of a preferred embodiment of the invention illustrated by way of example in the accompanying drawings in which.

DESCRIPTION OF PREFERRED EMBODIMENT

Figure 1:
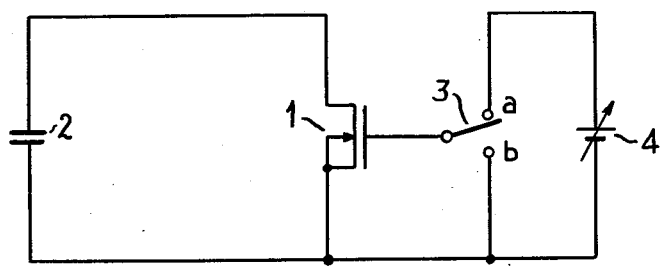
FIG. 1 is a circuit diagram of a simplified circuit illustrating the operating principle of the voltage detecting circuit in accordance with the invention.

In FIG. 1 there is shown a simplified circuit for explaining the operating principle of the voltage detecting circuit for a power source in accordance with the invention.

As illustrated in FIG. 1, a capacitor 2 is connected between the drain and source of an N-channel MOS field effect transistor 1 (hereinafter called a N-FET). The gate of the N-FET 1 is connected to the movable contact of a switch 3 having contact points $a$ and $b$ connected respectively to the positive and negative terminals of a battery cell 4 serving as the variable voltage power source. The negative terminal of the cell 4 is also connected to the source of the N-FET 1 and to one electrode of the capacitor 2.

Generally, in case the voltage $V_{DS}$ applied between the drain and the source of an MOS-FET is higher than the voltage difference between the gate-source voltage $V_{GS}$ and the threshold voltage $V_T$, the drain current of the MOS-FET depends on the gate-source voltage $V_{GS}$ and the threshold voltage $V_T$ regardless of the drain-source voltage.

Supposing that $k_1$ is a constant determined by the production and design parameters of the N-FET 1 as shown in FIG. 1, $V_{G1}$ is the gate-source voltage applied by the cell 4 and $V_{T1}$ is the threshold voltage of the N-FET 1, then $$ID_1 = k_1(V_{G1} - V_{T1})^2 \tag{1}$$

where $ID_1$ is the drain current.

Accordingly, assuming that the switch 3 is connected to the contact point $b$ and the capacitor 2 is charged so that the voltage between the terminals of the capacitor 2 is $$V_0[V_0 > (V_{G1} - V_{T1})]$$

the N-NET 1 is in the OFF state since the gate-source voltage is 0 volts.

Assuming that the switch 3 is now connected to the contact point $a$, the voltage of the cell 4 is applied as the gate-source voltage of the N-FET 1. If the voltage $V_E$ of the cell is greater than the threshold voltage $V_{T1}$, the N-FET 1 comes in the ON state whereby the electric charge of the capacitor 2 is discharged through the N-FET 1.

Figure 2:
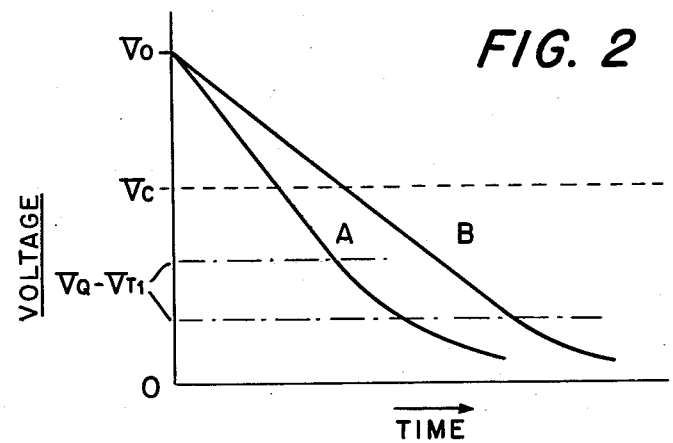
FIG. 2 is a graph illustrating the operation of the circuit of FIG. 1.

The rate of discharge is illustrated in FIG. 2 in which the voltage across the capacitor (i.e. the drain source voltage of the N-FET 1) is plotted against time. The curve A shows the state when the gate-source voltage $V_{G1}$ is high while curve B shows the state when the gate-source voltage is low.

As will be understood from FIG. 2, the drain current $ID_1$ of the N-FET 1 is constant when the voltage difference of the gate-source voltage $V_{G1}$ and the threshold voltage $V_{T1}$ is lower than the drain-source voltage (i.e. the voltage across the capacitor). This is represented by the straight line portions of the curves A and B.

Assuming that $C_1$ is the capacitance of the capacitor 2, the relation between the drain-source voltage $V_{DS1}$, the gate-source voltage $V_{G1}$ and the discharge time $t$ is represented by the following equation:

$$V_{DS1} = V_0 - ID_1 t_1/C_1 = V_0 - k_1(V_{G1} - V_{T1})^2 t_1/C_1 \tag{2}$$

where $ID_1$ is the drain current of the N-FET.

As will be understood from equation 2, when the gate-source voltage $V_{G1}$ is high, the drain current $ID_1$ increases and accordingly the discharging time of the constant voltage $V_C$ is short. When the gate-source voltage $V_{G1}$ is low, the discharging time of the constant voltage $V_C$ becomes long. Hence, the discharging time of the capacitor is a measure of the voltage of the power source.

Figure 3:
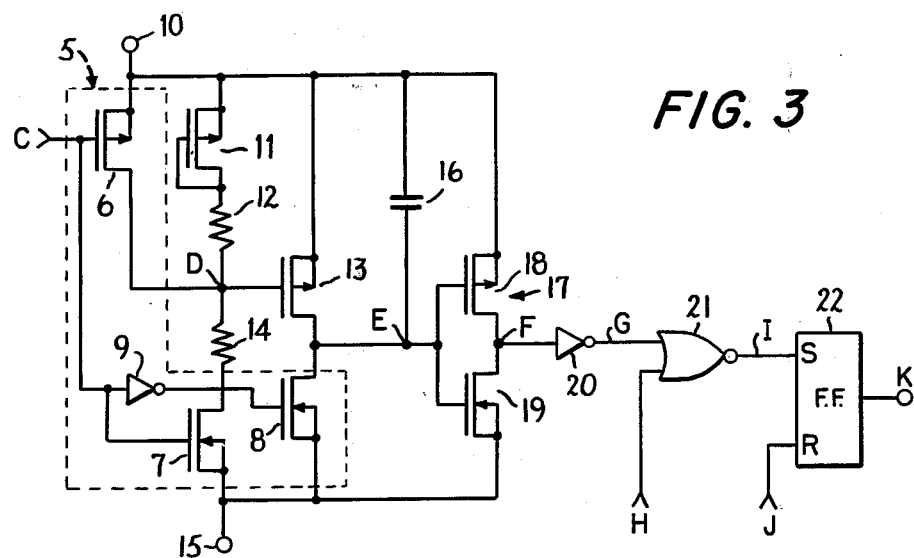
FIG. 3 is a circuit diagram of a voltage detecting circuit for a power source according to the invention.

FIG. 3 illustrates one embodiment of the invention using the operating principle described above. In FIG. 3, a switching circuit 5 (corresponding to the switch 3 of FIG. 1) is switched in response to an input pulse C. The switching circuit 5 comprises one P-channel MOS field effect transistor 6 (hereinafter called P-FET) and two N-channel MOS field effect transistors 7 and 8 (hereinafter called N-FETs). The respective gates of the P-FET 6 and the N-FET 7 receive the input pulse C. Also, the gate of the N-FET 8 receives the input pulse C through an inverter 9. The source of the P-FET 6 is connected to the high voltage point 10 of the power source. The source of each of the N-FETs 7 and 8 is connected to the low voltage point 15 of the power source.

The source of a P-FET 11 is connected to the high voltage point 10 of the power source while the gate and drain are connected through a resistor 12 and a connecting point D to the drain of the P-FET 6. The drain of the P-FET 6 is also connected through the connecting point D with the gate of a P-FET 13 and with one terminal of a resistor 14. The other terminal of the resistor 14 is connected to the drain of the N-FET 7. The drain of the N-FET 8 is connected to the drain of the P-FET 13 and to one terminal of a capacitor 16. The other terminal of the capacitor 16 and the source of the P-FET 13 are connected to the high voltage point 10 of the power source. It will thus be seen that the P-FET 13 is connected across the capacitor 16.

One terminal of the capacitor 16 (namely, the terminal connected to the drain of the N-FET 8 and the drain of the P-FET 13) is connected to the input terminal of an inverter 17 including a P-FET 18 and an N-FET 19. The conductive constant of the P-FET 18 is designed so as to be greater than the conductive constant of the N-FET 19.

The output signal of the inverter 17 is applied to one input terminal of a NOR gate 21 through an inverter 20. The other input terminal of the NOR gate 21 receives from a source H a pulse signal which is delayed by a predetermined time with respect to the input pulse C. The pulse signal H is a negative pulse rising when the input pulse signal C falls.

The output of the NOR gate 21 is applied to the set terminal S of a flip-flop 22 (hereinafter called FF) to the reset terminal R of which a reset pulse from a source J is applied before the input pulse is applied.

The operation of the embodiment shown in FIG. 3 will now be described with reference to the time chart shown in FIG. 4.

Figure 4:
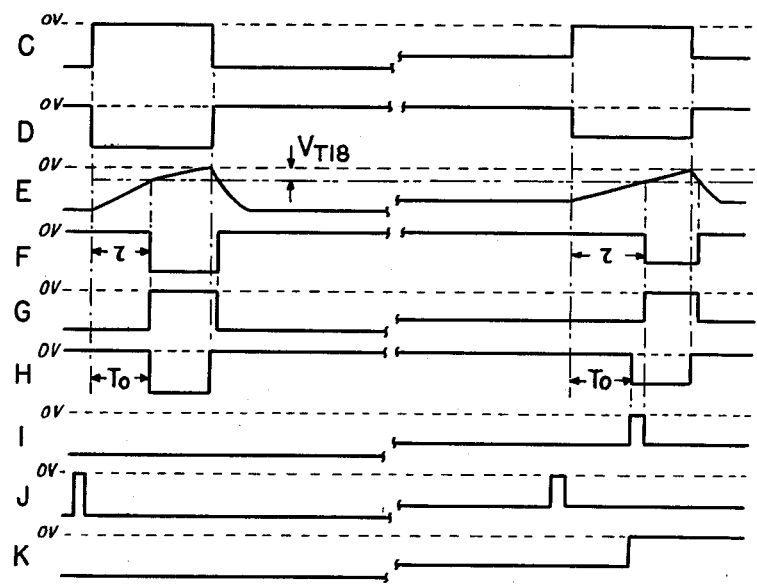
FIG. 4 is a time chart explaining the voltage detecting circuit illustrated in FIG. 3.

The switching circuit 5 receives the input pulse signal C as shown by the waveform C in FIG. 4. The P-FET 6 and N-FETs 7 and 8 are switched by this input pulse.

Accordingly, assuming that the voltage of the high voltage point 10 is 0 volt and the voltage at the low voltage point 15 is $-V_{SS}$, the P-FET 6 and N-FET 8 will be in the ON state when an input pulse is not applied. At this time, the N-FET 7 will be in the OFF state.

Also, the voltage of the drain of the P-FET 6 and hence the voltage of the gate of the P-FET 13 will be almost 0 volt. Accordingly, the P-FET 13 will be in the OFF state and the voltage across the capacitor 16 will be $V_{SS}$. Therefore, the P-FET 18 of the inverter 17 will be in the ON state whereby the output signal of the inverter 20 will be at logic level "0".

When the input pulse C is applied to the switching circuit 5, the P-FET 6 and N-FET 8 will be changed to the OFF state. On the other hand, the N-FET 7 and P-FET 13 will be in the ON state whereby the capacitor 16 will start to discharge through the P-FET 13. The discharging current is determined by the gate-source voltage $VG_{13}$ of the P-FET 13. This gate-source voltage $VG_{13}$ is determined by the P-FET 11, the resistors 12 and 14 and the N-FET 7 and by the voltage of the power source.

Assuming that the conductive resistance of the N-FET 7 is lower than the resistances of resistors 12 and 14 and that the threshold voltage of the P-FET 11 and the resistances of the resistors 12 and 14 are respectively $VT_{11}$, $R_{12}$ and $R_{14}$, the gate source voltage $VG_{13}$ is expressed by the following equation:

$$[VG_{13}] \approx R_{12}(V_{SS}-V_{T11})/R_{12}+R_{15}) + VT_{11} = (V_{SS}-V_{T11})/N + V_{T11} \tag{3}$$

where $N$ is $(R_{12} + R_{15})/R_{12}$.

Accordingly, the discharge current, namely the drain current $ID_{13}$ of the P-FET 13 is expressed by the following equation derived from equations (1) and (3):

$$ID_{13} = k_{13}\{(V_{SS}-V_{T13})/N\}^2 \tag{4}$$

where $k_{13}$ is the conductive constant of the P-FET 13 and $V_{T13}$ is the threshold voltage.

In FIG. 4, the gate voltage of the P-FET 13 is shown by the waveform D and the voltage change of the one electrode of the capacitor 16, namely the voltage change at the drain of the P-FET 13 is shown by the waveform E. As will be seen from these voltage waveforms, the gate voltage of the P-FET 13 is an inversion of the input pulse C.

The electric charge of the capacitor 16 starts discharging when the input pulse C is applied to the switching circuit 5, whereby the voltage of the electrode which is connected to the inverter 17 rises along a straight line as shown by the waveform E.

The waveform E also represents the gate voltage of the inverter 17 which rises with the discharge of the capacitor 16. When this gate voltage rises to a predetermined voltage level $-V_{T18}$ which is equivalent to the threshold voltage of the P-FET 18, the inverter 17 is inverted so that the output thereof becomes logic level "0" and the output of the inverter 20 becomes logic level "1". The threshold voltages of two MOS-FETs formed in the same chip are equal to one another.

Therefore, the time $\tau$ to attain the predetermined voltage level after the start of discharge of the capacitor 16 is expressed by the following equation derived from equations (2) and (4):

$$\tau = N^2 \cdot C/k_{13}(V_{SS}-V_{T13}) \tag{5}$$

It will be seen that the time $\tau$ becomes short if the voltage $V_{SS}$ is high. Accordingly, the pulse width of the output pulse of the inverter 17 becomes short since the time $\tau$ increases when the power source voltage becomes low as shown by the waveform F.

The output signal of the inverter 17 is inverted by the inverter 20 through which it is applied to one input terminal of the NOR gate 21 as shown in the waveform G. The other input terminal of the NOR gate 21 receives a negative pulse from a pulse source H as shown by the waveform H. It will be seen that this negative pulse is delayed by a predetermined time $T_o$ with respect to the input pulse shown by the waveform C.

Therefore, in case that the time at which the pulse produced at the input terminal of the inverter 20 after the input pulse C is applied to the switching circuit 5, namely the time at which the inverter 17 is inverted after the capacitor 16 starts discharging is shorter than the predetermined time $T_o$, the NOR gate 21 does not produce an output signal. However, if the power source voltage becomes low and the discharging time of the capacitor correspondingly becomes long, the time $\tau$ becomes greater than the predetermined time $T_o$. Therefore, the input of the NOR gate 21 becomes $-V_{SS}$ and the output of the NOR gate 21 which is connected to the terminal S of the FF 22 is shown by the waveform I.

The FF 22 receives the reset pulse as shown in the waveform J before the voltage of the cell is detected. With the application of the setting pulse the voltage of FF 22 becomes 0 volt as shown in the waveform K.

On the other hand, the gate voltage $-V_{18}$ of the inverter 17 varies with the ambient temperature. The power source voltage $V_{SS}$ when the time $\tau$ of the equation (5) becomes equal to the delay time $T_o$ is expressed by the following equation:

$$V_{SS} = N^2 \cdot C/k_{13} \cdot T_o + V_{T18} \quad (6)$$

The temperature variation of the threshold voltage ($V_{T18}$) of the P-FET 18 can be compensated by the temperature variation of the conductive constant $k_{13}$ of the P-FET 13. Accordingly, the temperature variation of the power source voltage, namely of the detected voltage can be made quite small.

In the embodiment of the invention as shown in FIG. 3, the purpose of the switching circuit 5 is to avoid dissipation of power of the power source by the detecting circuit. Therefore, the P-FET 6 of the switching circuit 5 may be eliminated if desired.

Figure 5:
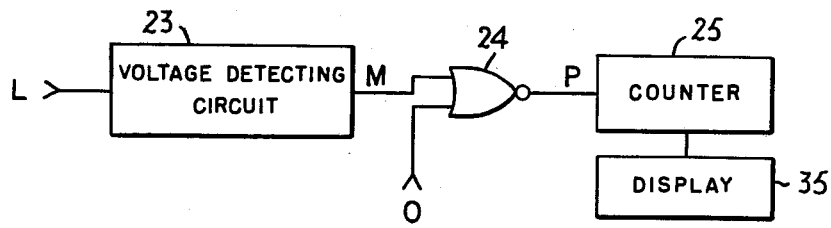
FIG. 5 is a block diagram illustrating the use of the voltage detecting circuit of FIG. 3.

FIG. 5 is a block diagram of a circuit using the power source voltage detecting circuit of FIG. 3. The block 23 represents the voltage detecting circuit including the circuit components designated by the reference numerals 5 to 20.

The output signal of the detecting circuit 23 for the power source voltage is applied to one input terminal of a NOR gate 24, the other terminal of which receives a clock pulse from a source 0. The output of the NOR gate 24 is connected to the clock input terminal of a counter 25.

Figure 6:
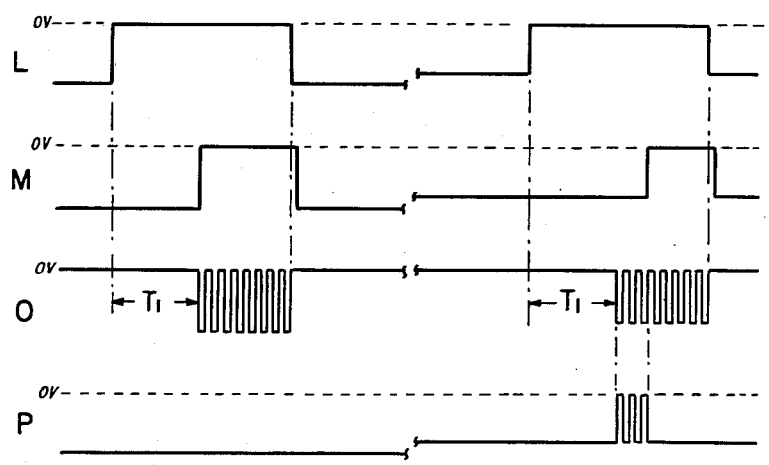
FIG. 6 is a time chart explaining the operation of the circuitry of FIG. 5.

Accordingly, a delay pulse as shown by the waveform M in FIG. 6 is produced from the output terminal of the voltage detecting circuit 23 when the voltage detecting circuit receives an input pulse in the waveform L at the input terminal. The other input terminal of the NOR gate 24 receives a clock pulse which is delayed a predetermined time with respect to the input pulse L as shown by the waveform 0. Accordingly, if the pulse derived from the voltage detecting circuit 23 has the delay time $T_1$, the pulse shown by the waveform P is produced by the NOR gate 24 and is counted by the counter 25. The drop of the power source voltage can be known quantitatively if the content of the counter 25 is displayed by a display device 35. A digital display of the power source voltage is thereby provided.

Figure 7:
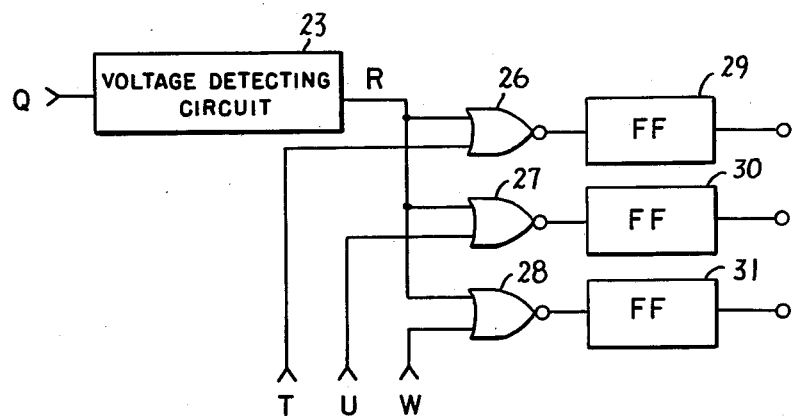
FIG. 7 is a block diagram illustrating another embodiment using the voltage detecting circuit in accordance with the invention.
Figure 8:
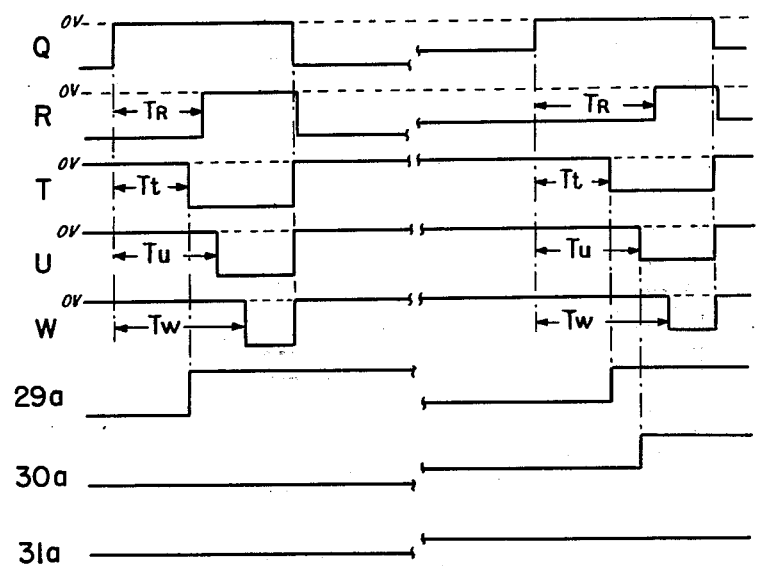
FIG. 8 is a time chart explaining the operation of the embodiment of FIG. 7.

FIG. 7 illustrates another embodiment of a circuit using the voltage detecting circuit of FIG. 3. The output signal of the voltage detecting circuit 23 for the power source voltage is applied to one input terminal of each of the NOR gates 26, 27 and 28 respectively. The respective outputs of the NOR gates 26, 27 and 28 is applied to flip-flops FF 29, FF 30 and FF 31. Accordingly, the output signal of the voltage detecting circuit 23 is represented by the waveform R of FIG. 8 when the voltage detecting circuit 23 receives an input pulse as shown by the waveform Q.

The other input terminals of the NOR gates 26, 27 and 28 receive respectively signals of waveforms T, U and W which are delayed predetermined times $T_j$, $T_u$ and $T_w$ with respect to the pulse shown as waveform Q. Therefore, only the output signal of FF 29 is at the state of logic level "1" when the power source voltage is at normal level and the delay time $T_R$ ($T_t$ is less than $T_R$ is less than $T_u$) produced from the voltage detecting circuit 23 for the power source at normal voltage. The delay time $T_R$ is prolonged when the power source voltage drops. When the relation of $T_R$ and $T_u$ is $T_R > T_u$, the output signals of flip-flops FF 29 and FF 30 become logic level "1". When the delay time $R_R$ has the relation of $T_R > T_w$ with a further drop in the power source voltage, the output signals of FF 29, FF 30 and FF 31 change to the logic level "1". Thus, an indication of the voltage of the power source is provided.

It will thus be seen that the circuit construction of a voltage detecting circuit in accordance with the invention includes a capacitor for charging and discharging. Accordingly, there is produced an output signal having a time width corresponding to the drop of the power source voltage so that the drop of the power source voltage can be displayed digitally.

Moreover, the voltage detecting circuit in accordance with the invention dissipates almost no power from the power source since the respective elements of the voltage detecting circuit are not in an active state before the capacitor starts charging or discharging. Furthermore, the voltage across the capacitor is held to the voltage before the capacitor discharges.

Accordingly, the capacitor is able to detect the power source voltage without affecting the operation of other circuitry supplied by the power source.

It will be obvious to those skilled in the art that many modifications and variations may be made in the structure described above. For example, instead of using a negative power source as described, a positive power source can be used with a little modification of the circuit. Furthermore, a plurality of voltages can be detected without requiring a plurality of voltage detecting circuits.

As mentioned above, the voltage detecting circuit for a power source according to the invention is able to detect the power source voltage by converting the variation of power source voltage into the charging and discharging time of a capacitor by controlling the charging and discharging current of the capacitor according to the variation of the power source voltage by means of circuitry including an MOS-FET. Accordingly, the output signal converted from a variation of power source voltage to a charging and discharging time of a capacitor can operate a digital display system.

Also, the voltage detecting circuit for a power source according to the invention is able to detect the power source voltage precisely without variation of the voltage serving as the detecting standard and depending upon the variation of the power source voltage since the voltage detecting circuit has an inverter which is inverted when the voltage of one terminal of the capacitor attains a predetermined voltage level in charging or discharging.

Furthermore, the voltage detecting circuit in accordance with the present invention is able to detect the power source voltage precisely independently of the ambient temperature since the circuit construction includes temperature compensating elements.

What I claim is:

1. A voltage detecting circuit for indicating a decrease in the voltage of a power source from an initial voltage comprising means for converting the voltage of said power source into a corresponding time delay, means providing a reference time corresponding to said initial voltage, means for measuring said time delay and comparing it with said reference time and means for displaying said voltage decrease as a function of the difference between said time delay and said reference time, said converting means comprising a capacitor, means for connecting said capacitor to said power source to be charged thereby, means for discharging said capacitor at a rate dependent on the voltage of said power source, and means for detecting the discharge of said capacitor to a predetermined level, said delay time being the discharge time of said capacitor to said predetermined level after initiation of discharge by said discharging means.

2. A voltage detecting circuit according to claim 1, in which said discharging means comprises an MOS-FET connected across said capacitor and a voltage divider connected across said power source and having a midpoint connected to the gate of said MOS-FET, whereby the drain current is determined by the voltage applied by said voltage divider to the gate of said MOS-FET.

3. A voltage detecting circuit according to claim 1, further comprising switching means for switching said detecting circuit ON intermittently.

4. A voltage detecting circuit according to claim 1, in which said time delay measuring means comprises a clock pulse generator and counting means for counting said clock pulse during said time delay corresponding to said voltage decrease of said power source.

5. A voltage detecting circuit according to claim 4, in which said display means comprises means for digitally displaying the counted content of said counting means.

6. A voltage detecting circuit according to claim 1, in which said time delay measuring means comprises a plurality of NOR gates each having one input terminal connected to the output of said converting means and each having another input terminal connected respectively to a delay pulse means, providing pulses of different length to said NOR gates respectively, and a like plurality of flip-flop circuits connected respectively to the outputs of said NOR gates, the delay times of said delay pulse means being progressively longer than the time delay of said converting means when said power source voltage is normal, whereby said flip-flops are successively actuated as said power source voltage decrease and said time delay becomes progressively longer so as to coincide successively with the delay times of said delay pulse means.

* * * * *